United States Patent [19]

Abbiate et al.

[11] Patent Number: 5,196,853
[45] Date of Patent: Mar. 23, 1993

[54] SIGMA DELTA CONVERTER INSENSITIVE TO ASYMMETRICAL SWITCHING TIMES

[75] Inventors: Jean-Claude Abbiate, La Gaude; Gerard Richter, Nice, both of France

[73] Assignee: International Business Machines Corp., Armonk, N.Y.

[21] Appl. No.: 797,609

[22] Filed: Nov. 25, 1991

[30] Foreign Application Priority Data

Jan. 15, 1991 [EP] European Pat. Off. ......... 91480009.9

[51] Int. Cl.[5] .............................................. H03M 3/02
[52] U.S. Cl. ..................................... 341/143; 341/172
[58] Field of Search ........................ 341/143, 150, 172

[56] References Cited

U.S. PATENT DOCUMENTS

| | | | |
|---|---|---|---|
| 3,956,700 | 5/1976 | Condon | 341/143 |
| 4,588,981 | 5/1986 | Senn | 341/143 |
| 5,027,120 | 6/1991 | Thurston | 341/143 |
| 5,061,928 | 10/1991 | Karema et al. | 341/143 |
| 5,073,777 | 12/1991 | Fukuhara et al. | 341/131 |

FOREIGN PATENT DOCUMENTS

| | | |
|---|---|---|
| 0399738 | 11/1990 | European Pat. Off. |
| 0407674 | 1/1991 | European Pat. Off. |
| 2111332 | 6/1983 | United Kingdom . |

OTHER PUBLICATIONS

IBM Technical Disclosure Bulletin, vol. 32, No. 6A, Nov. 1989, New York, pp. 391-392, "Delta-Sigma Converter Having Linear Conversion Transfer Function Independent of Signal Edge Transition Asymmetry of the Coder".

*Primary Examiner*—Marc Hoff
*Attorney, Agent, or Firm*—Edward H. Duffield

[57] ABSTRACT

Sigma-delta converter for converting an analog input signal into a sigma-delta code. The converter includes a threshold device (222) for generating an output and feedback signal, a filter receiving said analog input signal and said feedback signal from at least one feedback loop. The sigma-delta converter further includes circuits (221, 222) located in said feedback loop for performing a return-to-zero of the sigma-delta code generated by said threshold device at every period of the sigma delta clock, whereby said sigma-delta converter is insensitive to the asymmetry of the rise and fall time of the threshold device. This results in an increase of the signal-to-noise ratio and linearity of the converter, allowing the manufacture of a sigma-delta convertor with discrete components without requiring the development of an integrated circuit using switched capacitor technology.

4 Claims, 3 Drawing Sheets

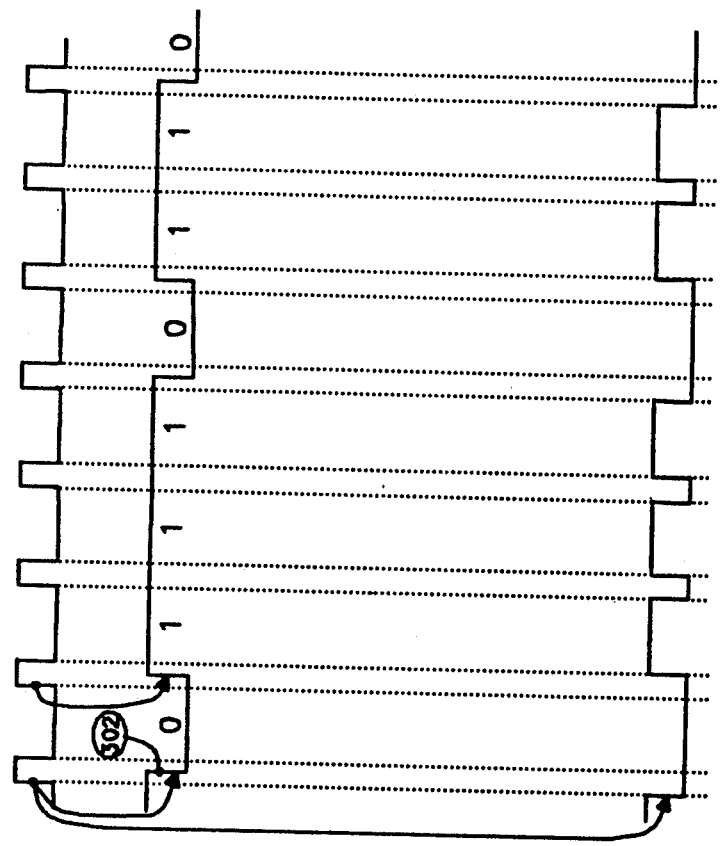

SIGMA DELTA CONVERTER INSENSITIVE TO ASYMMETRICAL SWITCHING TIMES

FIELD OF THE INVENTION

The invention relates to analog-to-digital converters and particularly to sigma-delta converters used in such converters.

BACKGROUND ART

Sigma-delta converters are of great use in modern sophisticated systems using digital signal processing technology. They particularly permit the development of efficient Analog-to-digital (A/D) and Digital-to-Analog (D/A) converters for transforming analog information into a form suitable for digital handling, and vice versa. Numerous architectures for sigma-delta converters exist in the art. An existing, simple, but efficient architecture which is often used is the "double-loop" architecture shown in FIG. 1 and described in detail hereinafter. The prior sigma-delta architecture provides a satisfactory theorical performance and can be embodied in two distinctive ways: a first embodiment using discrete components and a second one using integrated technology.

The double-loop architecture can, firstly, be embodied in discrete components which are wired on a printed circuit board, thus making up a simple and low-cost converter. However, such an embodiment is rarely used in the art in view of the fact that the actual performance which can be obtained with the discrete implementation is far from the expected theorical performance of the double-loop architecture. For instance, for a double-loop sigma-delta architecture leading to a theorical signal-to-noise ratio of about 80 dB, the corresponding converter which uses a discrete implementation will eventually provide a ratio of only 65 dB. The weak performances obtained by the discrete implementation are due to the switching noise coming from the switching components and from the asymmetry of the rise and fall time in the different analog signals and particularly at the output of the digitizer.

In order to improve the actual signal-to-noise ratio of the sigma-delta converter, electronic manufacturers have designed a second embodiment which uses an integrated technology. The actual performance of the integrated sigma-delta converter is far better than that of the previous converter using discrete components because the physical dimensions of the converter are reduced. Also, since the integrated sigma-delta converter consumes less power, the switching noise is reduced.

Thirdly, integrated sigma-delta converters which exist in the art are based on the switched capacitor technology widely used in the field of integrated analog filter design since capacitors are very easy to integrate on a chip. A sigma-delta converter using the switched capacitor technique is described in detail in U.S. Pat. No. 4,746,899 entitled "Method for Reducing Effects of Electrical Noise in an Analog-to-Digital Converter", is further not subject to the above asymmetry problem. As a result, an integrated sigma-delta converter using the switched capacitor technique has good performance and particularly provides an actual signal-to-noise ratio very close to the theorical value, about 78 dB, noted in the above theoretical example. However, the integrated sigma-delta converter presents a major drawback in that it requires the design, development and manufacture of an integrated circuit which is a long and expensive operation.

Therefore a need exists in the art for a simple and low-cost sigma-delta converter made up with common, discrete, (off-the-shelf) components which, nevertheless, provides actual performances in terms of signal-to-noise ratio and linearity which are close to those reached with integrated sigma-delta converters.

OBJECTS OF THE INVENTION

It is an object of the invention to provide an improved, simple sigma-delta converter providing an actual signal-to-noise ratio close to the theorical maximum value.

It is another object of the invention to provide a simple sigma-delta converter which can be easily built up on a printed circuit board with discrete components and achieving an efficient sigma-delta conversion process.

It is a further object of the invention to provide a simple sigma-delta converter which can be embodied with discrete components and which delivers a train of sigma-delta pulses which can be transmitted to a decimator in order to provide an efficient analog-to-digital converter.

It is a further object of the invention to provide a simple sigma-delta converter using discrete, (off-the-shelf) components which is insensitive to the asymmetry of the rise time and the fall time of the switching components included therein.

BRIEF SUMMARY OF THE INVENTION

These and other objects of the invention are provided by means of a sigma-delta converter according to the present invention which includes a latch for delivering a train of sigma-delta pulses in accordance with the output signal of an analog filter. The analog filter receives the analog input signal to be converted and also receives a feedback of the sigma-delta code generated by the latch. The sigma-delta converter further includes means located in the feedback loop for introducing a return-to-zero of the analog signal representing the sigma-delta code available at the output of the latch at every period of the sigma-delta clock. This renders the converter insensitive to the mismatch of the rise and fall time of the latch thereby improving the linerity of the sigma-delta conversion and the signal-to-noise ratio.

In a preferred embodiment, the sigma-delta converter is a double-loop sigma-delta converter. This results in a simple sigma-delta converter which can be built with discrete (off-the-shelf) components and which, nevertheless, provides a high signal-to-noise ratio.

In a another preferred embodiment, the sigma-delta converter comprises a D-type latch for generating the train of sigma-delta pulses and a set of two operational amplifiers connected in order to form two integrator circuits forming a double-loop feedback circuit. This provides a low cost sigma-delta converter which can be embodied on a printed circuit board and which still delivers a efficient sigma-delta coded signal.

In another embodiment of the invention, the sigma-delta converter is a converter generating a sigma-delta coded signal which is transmitted to a decimation circuit in order to create a simple and efficient A/D converter.

The invention also provides a base-band DCE having a simple sigma-delta converter.

BRIEF DESCRIPTION OF THE DRAWINGS

FIG. 3A, 3B and 3C are timing diagrams illustrating the operation of the sigma-delta converter according to the invention.

DETAILED DESCRIPTION OF THE PREFERRED EMBODIMENT OF THE INVENTION

Figure 1:
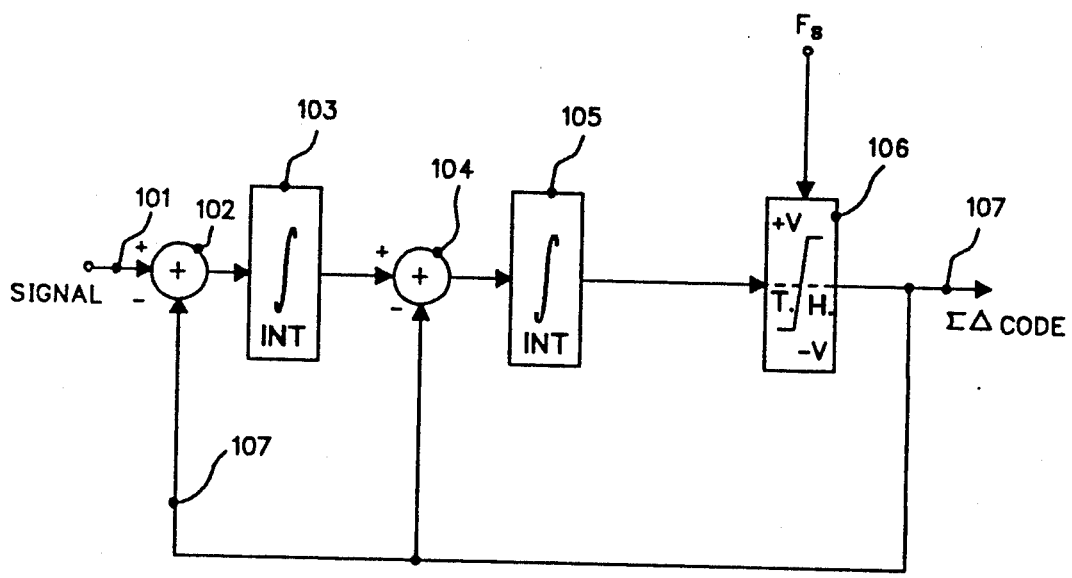
FIG. 1 illustrates the prior art architecture of a double-loop sigma-delta converter useful for converting an analog signal into a sigma-delta code.

FIG. 1 shows prior art the principle of a double loop sigma-delta converter which provides a train of sigma-delta code pulses representing an analog signal to be converted. The converter comprises a first subtractor 102, a first integrator 103, a second subtractor 104, a second integrator 105, and a threshold device 106. The threshold device 106 can be embodied by means of a latch or a comparator and is controlled by a sigma-delta clock Fs. Threshold device 106 provides on node 107 an output and feedback signal. The latter double-loop architecture can be embodied with analog components in order to provide the conversion of an analog signal into a sigma-delta code. The asymmetry of the rise time and the fall time of the threshold device strongly jeopardizes the linearity and the signal-to-noise ratio of the converter. The effects of the latter asymmetry in terms of linearity have been clearly developed in the IEEE Journal of Solid-State Circuits, Vol. SC-14 N°1, February 1979 "A Single-Channel PCM Codec" by J. D. EVERARD. For that reason, the implementation of the double-loop sigma-delta coder with low cost analog discrete components has rarely been used in the past. To remedy that problem, manufacturers have been compelled to use integrated sigma-delta converters based on the technique of switched capacitors. They consequently have to design, test and manufacture complex integrated chips.

Figure 2B:
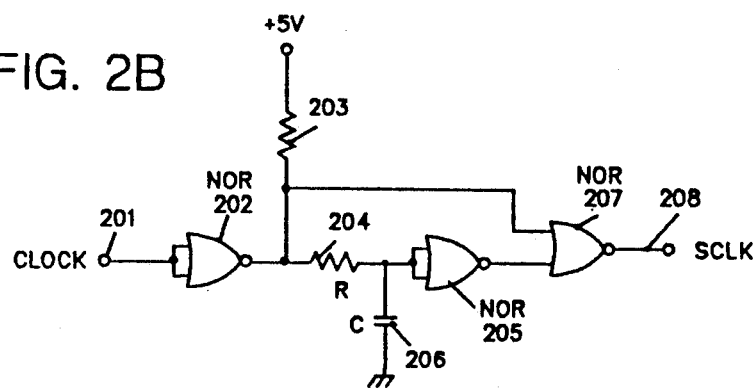
FIG. 2A and 2B illustrate a double-loop sigma-delta converter in accordance with the present invention.
Figure 2A:
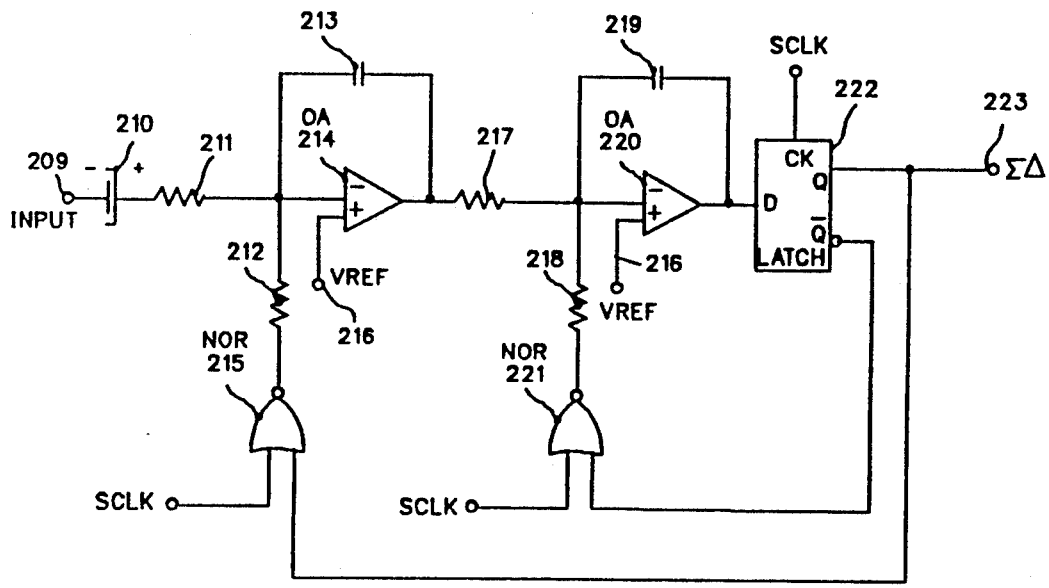

FIG. 2A illustrates a double-loop sigma-delta converter according to the present invention which is embodied with discrete analog components and which provides an actual signal-to-noise ratio close to the theorical maximum ratio. It is also close in performance to that provided by the corresponding sigma-delta converter embodied in an integrated circuit with the switched capacitor technique. With respect to FIG. 2A, the DC component of the analog signal to be converted is suppressed by means of a capacitor 210. The resulting signal is transmitted to a first lead of a resistor 211 having a second lead respectively connected to the inverting input of an operational amplifier (OA) 214, to a first lead of a resistor 212 and to a first lead of a capacitor 213. The output of the latter operational amplifier is connected to a second lead of capacitor 213 and to a first lead of a resistor 217 having a second lead respectively connected to the inverting input of a second operational amplifier 220, to a first lead of a resistor 218 and to a first lead of a capacitor 219. Operational amplifier 220 has its output lead connected to a second lead of capacitor 219 and to the D-input lead of a D-type latch 222 used as a threshold device. Latch 222, being a latch of the type 7474 well known in the art, provides at its output leads a sequence of voltages being either equal to 5 Volts (or Vcc more generally) or 0 Volt, at the rhythm of a Sclk clock existing at its CK input lead. An example of a circuit for generating the latter Sclk clock will be described hereinafter with reference to FIG. 2B. A reference potential Vref, being equal to half the value of the positive supply voltage of latch 222, is transmitted to the non-invert input of operational amplifiers 218 and 220 via a lead 216. The non-inverted Q output lead 223 of latch 222 is connected to a first input of a NOR gate 215 of the type 7402 well known by the skilled artisan having its second input lead receiving the Sclk clock and also an output lead connected to a second lead of resistor 212. The inverted output lead of latch 222 is connected to a first input of a NOR gate 221 which has its second input lead receiving the Sclk clock and also an output lead connected to a second lead of resistor 218. It appears that the feedback signal appearing at the output of NOR 215 is added to the analog input AC voltage to be converted and then integrated by means of the circuit formed by OA 214, resistors 211 and 212 and capacitor 213. Similarly, the feedback signal appearing at the output of NOR 221 is added to the signal at the output of OA 214 and integrated by means of the circuit based on OA 220, resistors 217 and 218, and capacitor 219. Thus the circuit of FIG. 2A has a double feedback loop similar to that of the architecture shown with respect to FIG. 1. The output Q of latch 222 provides a train of sigma-delta pulses which can be used to drive a decimation filter (not shown) in order to make up a full Analog-to-Digital converter.

FIG. 2B shows a preferred embodiment of the Sclk clock generator in accordance with the present invention. A NOR gate 202, connected as an inverter, has its two input leads receiving a square wave clock signal having the desired sigma-delta frequency. The output of NOR 202 is connected to a first lead of a resistor 204, to a first lead of a resistor 203 having its second lead connected to the voltage supply (5 Volts in the preferred embodiment), and to a first input of a NOR gate 207. Resistor R 204 has a second input which is connected to a first input of a capacitor C 206 having a second lead connected to ground, and to the two input leads of a NOR gate 205, the output of which being connected to a second input of NOR 207. The output of NOR 207 eventually provides on a lead 208 the required Sclk clock. NOR gate 202 is used as an inverter and permits to supply enough current to drive the electronic components being connected.

FIGS. 3A, 3B and 3C respectively shows timing diagrams of the voltages existing on leads 208, 223 and 215. As illustrated in the figures, Sclk clock appears to be a train of pulses at the oversampling frequency, the pulses being very short and largely exagerated on FIG. 3A. That train of pulses is respectively transmitted to one input of NOR gates 215 and 221 in both feedback loops of the sigma-delta converter and causes a return-to-zero of the output voltage of NOR 215 and NOR gate 221 at every raising edge of the Sclk clock. In this way, two adjacent "1"s ("ONE") in the train of sigma-delta pulse on lead 223 causes the appearance of two pulses at the output of NOR gate 215. Therefore, the "weight" of two adjacent "1" will be exactly twice the "weight" of one "1", which was not the case in the conventional sigma-delta converter because of the asymmetry of the rise time and fall time of the converter. The linearity of the converter and its actual signal-to-noise ratio are substantially improved and reaches those obtained by integrated sigma-delta converters which traditionally use the switched capacitor technique. The Sclk clock introduced in both feedback loops by means of NOR gates 215 and 216 entails the appearance in the sigma-delta code of a DC component proportional to the pulse width of SCLK clock. The latter DC component will be easily suppressed by traditional digital handling methods well known by the skilled man, by choosing appropriate values of resistor 204 and capacitor 206 so that R×C becomes negligible relative to the full period of the SCLK clock.

It should be noticed that the artisan skilled in the art will easily and straightforwardly embody the invention with a circuit in the feedback loops which generates a return-to-one at every raising edge of the SCLK clock signal.

It can be advantageous in some cases to choose a R×C value leading to a non-negligible pulse width in the Sclk clock. It has been discovered that, if the latter width is not negligible, the sigma-delta converter introduces an amplification step in the conversion process, the amplification being determined by the width of every pulse in Sclk clock. The width can be controlled by means of an adjustable resistor 204 or still by means of a digital circuit providing numerous clocks having the desired duty cycle form and associated with a switch (not shown) for selecting the appropriate clock. In the preferred embodiment of the invention, the sigma-delta converter is not associated with an amplification step. For that purpose, resistance R and capacitor C are chosen so that the product R×C is negligible with respect to the full period of the Sclk clock.

In the preferred embodiment of the invention, the train of sigma-delta pulses delivered by latch 222 on lead 223 is transmitted to a decimation filter in order to build a simple and efficient analog-to-digital converter. The A/D converter can be used for embodying a wideband base Data Circuit terminating Equipment (DCE).

The sigma-delta converter according to the present invention can also be used for embodying an efficient digital-to-analog converter. In this type of converter, the sigma-delta converter is used for converting a Pulse Coded Modulated signal (PCM) into a train of sigma-delta pulses. This is achieved by implementing the architecture of FIG. 1 by means of a digital processing system providing at its output a sigma-delta code. The latter sigma-delta code can therefore be transmitted to a low-pass filter in order to produce an analog output signal representative of the digital PCM signal. Since the train of sigma-delta code pulses generated by one latch is also affected by the mismatch of its rise and fall time, it can be advantageous to connect a NOR gate having a first input receiving the sigma-delta code, a second input connected to the Sclk clock and having an output connected to the input of the low pass filter. The return-to-zero of the sigma-delta signal is no longer provided in the feedback loop but between the latch providing the sigma-delta code and the low pass filter. The result is an improvement of the signal-to-noise ratio and of the linearity of the digital-to-analog converter.

We claim:

1. Sigma-delta converter for converting an analog input signal into a sigma-delta code including a threshold device (222) for generating an output and feedback signal, a filter (214, 220) receiving said analog input signal and said output and feedback signal by means of at least one feedback loop, characterized in that it further includes:
   means (215, 221) located in said at least one feedback loop for performing a return-to-specified-logical-state of the sigma-delta code generated by said threshold device at every period of the sigma delta clock whereby said sigma-delta converter is insensitive to the asymmetry of the rise and fall times of said threshold device and further including: means (204, 206, 205, 207) for varying the duration of said return-to-zero thereby introducing an amplification step into the sigma-delta conversion process.

2. Sigma delta converter according to claim 5 characterized in that it includes:
   a first integrator (214, 213, 211, 212) receiving said analog input signal to be converted and a first feedback signal coming from a first said feedback loop,
   a second integrator (220, 217, 218, 219) receiving the analog output of said first integrator and a second feedback signal coming from a second said feedback loop and having an output lead connected to said threshold device,
   first means (215, 208) for performing a return-to-zero of the feedback signal conveyed through said first feedback loop to said first integrator and further including:
   a latch (222) clocked by a sigma-delta clock (sclk) and generating a sigma-delta code at a first output lead and an inverted sigma-delta code at a second output lead,
   said first integrator (214, 211, 212, 213) receiving the analog input signal to be converted and a first feedback signal coming from a first NOR gate (215) having a first input connected to said clock and a second input connected to said first output of said latch (222),
   said second integrator (220, 217, 218, 219) receiving the output signal of said first integrator and a second feedback signal coming from a second NOR gate (221) having a first input receiving said clock and a second input connected to said second output of said latch (222).

3. Sigma-delta converter according to claim 2 characterized in that said first integrator includes a first operational amplifier (214) having a inverting input connected to a first resistor (211) receiving said analog input signal to be converted, to a second resistor (212) connected to the output of said first NOR gate (215), and to a first lead of a capacitor (213) having a second lead connected to the output of said first operational amplifier, said operational amplifier having a non-inverting input connected to a reference potential.

4. Sigma-delta converter according to claim 3 characterized in that said second integrator includes a second operational amplifier (220) having an inverting input connected to a third resistor (217) also connected to the output of said first operational amplifier, to a fourth resistor (218) connected to the output of said second NOR gate (221), and to a first lead of a second capacitor (219) having a second lead connected to the output of said second operational amplifier, said operational amplifier having a non-inverting input connected to said reference potential (Vref).

* * * * *